Figure 1:
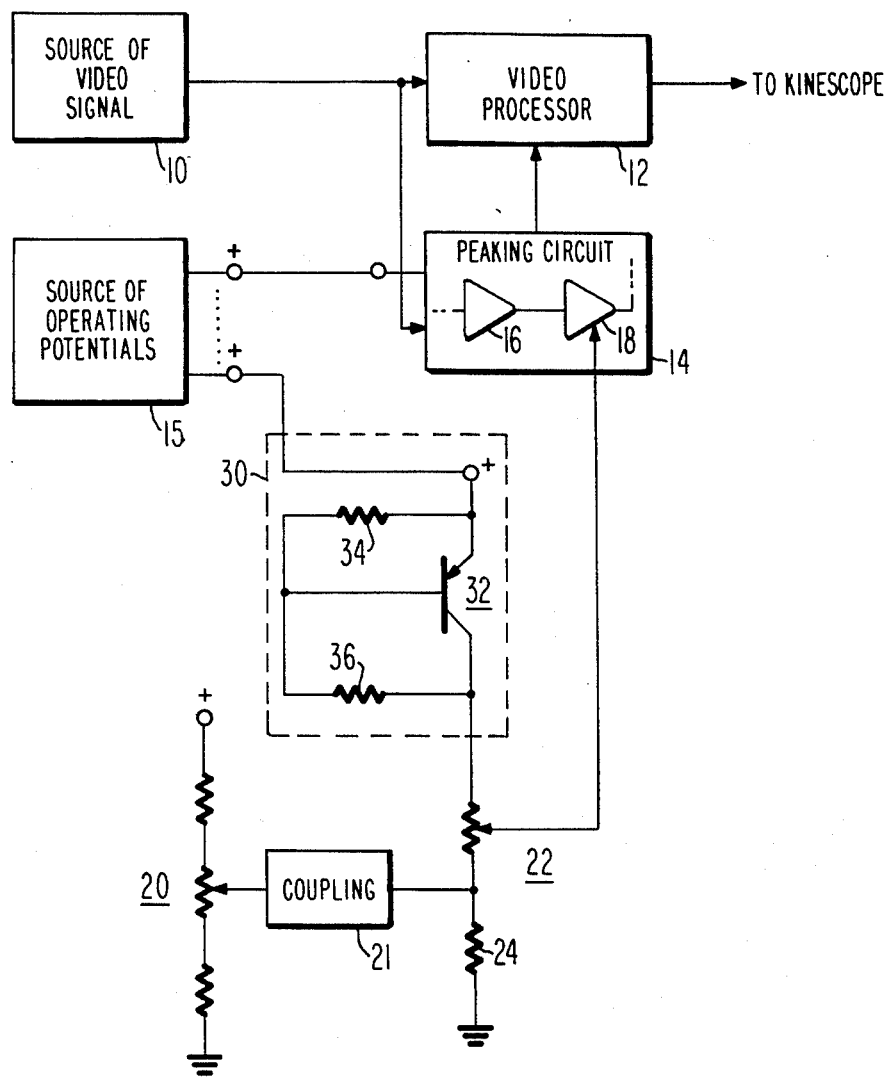

United States Patent [19]

Lagoni et al.

[11] Patent Number: 4,749,889

[45] Date of Patent: Jun. 7, 1988

[54] TEMPERATURE COMPENSATION APPARATUS

[75] Inventors: William A. Lagoni; Isaac M. Bell; Robert P. Parker, all of Indianapolis, Ind.

[73] Assignee: RCA Licensing Corporation, Princeton, N.J.

[21] Appl. No.: 932,579

[22] Filed: Nov. 20, 1986

[51] Int. Cl.⁴ .................. G01K 7/24; H03K 17/14
[52] U.S. Cl. .................... 307/491; 307/310; 307/591; 330/289; 358/166
[58] Field of Search .............. 307/310, 491, 591; 328/3; 330/256, 266, 272, 289; 358/37, 166; 361/100

[56] References Cited

U.S. PATENT DOCUMENTS

| | | | |
|---|---|---|---|
| 3,555,309 | 1/1971 | Limberg | 307/297 |
| 3,557,383 | 1/1971 | Wavre et al. | 328/167 |
| 3,973,147 | 8/1976 | Yu | 307/310 |
| 4,207,538 | 6/1980 | Goel | 330/289 |
| 4,260,956 | 4/1981 | Harford | 330/289 |
| 4,494,145 | 1/1985 | Kokufukata et al. | 358/166 |
| 4,652,144 | 3/1987 | Günther et al. | 307/310 |

OTHER PUBLICATIONS

Figure 255, pp. 178-180 of Power Transistor Applications Manual, Solid State Division, RCA Corporation.

*Primary Examiner*—Stanley D. Miller
*Assistant Examiner*—Tai V. Duong
*Attorney, Agent, or Firm*—Paul J. Rasmussen; Peter M. Emanuel; Ronald H. Kurdyla

[57] ABSTRACT

A so-called "$V_{BE}$ multiplier" circuit is used to temperature compensate a semiconductor device with respect to both short term self-heating effects and long term ambient temperature effects. The compensation circuit includes a transistor with a base, an emitter coupled to an operating potential, and a collector coupled to an operating potential. First and second resistors are respectively coupled across the base-emitter and collector-base junctions of the transistor. The values of the resistors as chosen so that a voltage derived from the collector-emitter path of the transistor and applied to the semiconductor device exhibits a temperature coefficient which substantially matches the temperature coefficient of the semiconductor device.

5 Claims, 2 Drawing Sheets

TEMPERATURE COMPENSATION APPARATUS

This invention concerns apparatus for temperature compensating the operation of an electrical circuit including a semiconductor device.

Electrical circuits including semiconductor devices are often temperature compensated by various means to prevent the operating characteristics of the circuits from varying undesirably with changes in temperature. Several different thermal processes must be taken into account in the design of temperature compensation apparatus. In the case of an integrated circuit semiconductor device for example, one thermal process involves the self-heating of the integrated circuit, wherein a temperature increase developed in the substrate and semiconductor elements of the integrated circuit progresses to the surface of the integrated circuit. This process begins when the device is energized and exhibits a relatively short thermal time constant of several minutes, at which point the temperature of the device due to self-heating is substantially stable. Another thermal process involves an ambient temperature change in the immediate vicinity of the integrated circuit, such as an increase in temperature inside the cabinet of a television receiver containing the integrated circuit, beginning soon after the receiver is energized. In this case a temperature increase developed at the surface of the integrated circuit progresses inward, and typically exhibits a much longer time constant (e.g., ten times longer) than the time constant of the self-heating process. A change in the ambient temperature of the room in which the receiver is located further complicates the temperature compensation procedure.

Known techniques for temperature compensating semiconductor devices such as transistors and integrated circuits include the use of elements such as thermistors, diodes, transistors and resistors which sense the temperature change to which the device being compensated is subjected and exhibit operating characteristics which vary with temperature so as to compensate for an otherwise unwanted change in the operation of the device being compensated. The compensating elements are thermally coupled to the device being compensated, such as by being located within the same integrated circuit device or by being attached to the heatsink of the device being compensated. It is herein recognized, however, that such manner of thermal coupling may be unavailable for one reason or another, so that alternative means must be used to achieve appropriate temperature compensation in some systems.

For example, U.S. Pat. No. 4,388,648—Harwood et al. describes a system for automatically controlling the high frequency peaking content of a video signal to thereby control the "sharpness" of a displayed picture. The system disclosed in this patent is intended for the most part to be constructed as an integrated circuit and utilizes closed loop feedback control to automatically maintain a desired amount of video signal peaking. The system includes plural gain controlled amplifiers, a manually adjustable peaking control potentiometer and an LC bandpass filter coupled to a first external terminal of the integrated circuit, and an RC peak detector filter coupled to a second external terminal. The feedback control loop is capable of correcting errors, such as gain mistracking errors of the amplifiers, caused by temperature changes. It may be desirable to operate such video peaking system in an open-loop configuration rather than in a closed-loop configuration under certain conditions. This can be readily achieved by removing the LC filter and the RC peak detector filter, and by coupling the wiper of the peaking control potentiometer to the second terminal in place of the RC filter. However, an open-loop configuration increases the likelihood that the system will exhibit unwanted changes in operating characteristics due to temperature changes. Specifically, it has been observed that, for a given value of peaking control voltage from the control potentiometer, the amount of video signal peaking may vary by ±40% until the temperature affecting the system has stabilized, e.g., after about one hour in a television receiver environment.

To redesign such integrated circuit system to eliminate the possibility of temperature dependent errors in the open-loop configuration, or to develop another integrated circuit system intended only for open-loop operation, would be costly and may involve compromises in other areas. Thus it is desirable to be able to use a system such as that disclosed in the Harwood patent in an open loop configuration without experiencing operating errors due to long and short term temperature effects. This result can be achieved by employing a temperature compensation arrangement of the type disclosed in a copending U.S. patent application of Isaac M. Bell, Ser. No. 924,316 titled "Temperature Compensation Apparatus for an Electrical Circuit". However, that arrangement employs a relatively costly combination of a thermistor and capacitor to compensate for short term self-heating effects and for long term ambient temperature effects. The apparatus disclosed herein in accordance with the present invention achieves the desired result of both long and short term temperature compensation by means of an economical circuit which does not employ a thermistor or capacitor.

In accordance with the principles of the present invention, a so-called "$V_{BE}$ multiplier" circuit is used to compensate the operation of a temperature dependent semiconductor device with respect to both short term effects due to self-heating of the semiconductor device, and long term effects due to ambient temperature changes. The disclosed temperature compensation circuit includes a transistor with a base, collector and emitter electrodes. The collector-emitter path of the transistor is coupled between first and second operating potentials. A first resistor is coupled across a forward biased base-emitter junction of the transistor, and a second resistor is coupled across a reverse biased collector-base junction of the transistor. The values of the first and second resistors are chosen so that a voltage derived from the collector-emitter path of the transistor and applied to the semiconductor device exhibits a temperature coefficient which substantially matches a temperature coefficient of the semiconductor device.

Figure 2:
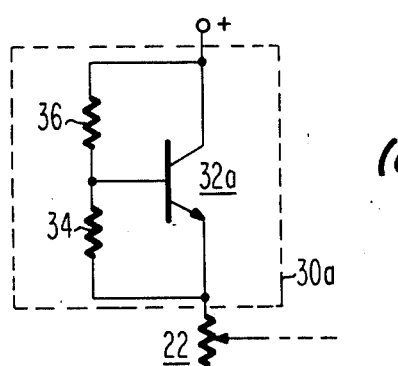
Figure 2:
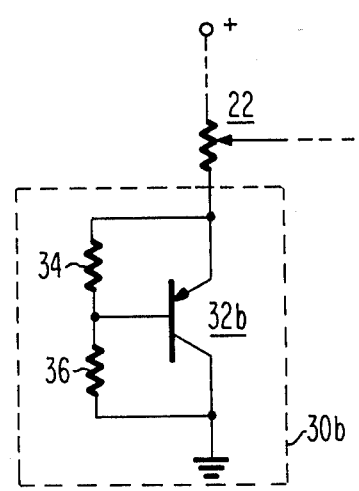
Figure 2:
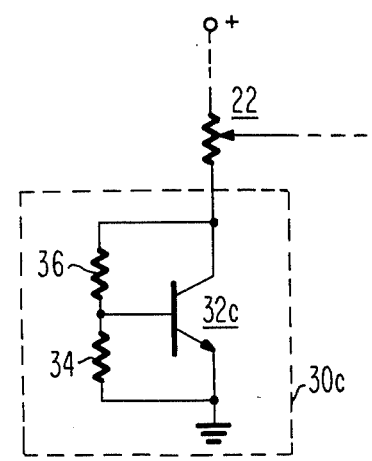

In the drawing:

FIG. 1 shows a portion of a television receiver including a temperature compensation circuit in accordance with the principles of the present invention; and FIG 2(A-C) illustrates alternative embodiments of temperature compensation circuits in accordance with the present invention.

In FIG. 1, a video signal from a source 10 is applied to a video signal processor 12 which provides an output video signal to an image reproducing kinescope (not shown). The high frequency content of the video signal from processor 12 is controlled in response to an output signal, e.g., including a peaking component having preshoot and over-shoot components as known, from a peaking control circuit 14 which responds to the video signal from source 10 as discussed in aforementioned U.S. Pat. No. 4,388,648. Peaking circuit 14 is energized by means of an operating potential (+) from a source 15. Peaking control circuit 14 includes amplifiers 16 and 18, among the circuit elements. The gain of amplifier 18, and thereby the magnitude of the peaking components in the output signal from circuit 14, is controlled in response to the setting of a peaking control potentiometer 20. A peaking control voltage from the wiper of potentiometer 20 is conveyed to a gain control input of amplifier 18 via a coupling network 21 and a factory pre-set potentiometer 22. Potentiometer 22 determines the maximum amount of peaking available, and compensates for tolerances associated with peaking circuit elements. In this example the signal gain of peaking circuit 14 varies undesirably with temperature, causing a significant unwanted change in the amount of peaking present in a displayed picture until the temperature of circuit 14 stabilizes.

The temperature dependent variation in the gain of circuit 14 is compensated for by means of a compensation circuit 30. Circuit 30 is a so-called "$V_{BE}$ multiplier", and includes a PNP transistor 32, a first resistor 34 coupled across the base-emitter junction of transistor 32, and a second resistor 36 coupled across the collector-base junction of transistor 32. A voltage developed across the collector-emitter junction of transistor 32 is a multiple of the base-emitter junction voltage ($V_{BE}$) of transistor 32 in accordance with the values of resistors 34 and 36. An operating potential (+) for the emitter circuit of transistor 32 is provided from source 15 and appears when the receiver is energized.

The collector-to-emitter voltage of transistor 32, $V_{CE}$, closely approximates a multiple of voltage $V_{BE}$ by the ratio of the value of resistor 36 (R36) to the value of resistor 34 (R34) in accordance with the expression:

$$V_{CE} = V_{BE}(1 + R36/R34)$$

The temperature compensation produced by circuit 30 is due to the fact that the emitter current of transistor 32, $I_E$, exhibits a temperature dependency in accordance with the well-known expression:

$$I_E = I_{ES}[e^{qV/KT} - 1]$$

where $I_E$ is the emitter current of transistor 32,
$I_{ES}$ is the emitter saturation current of transistor 32,
q is electron charge (coulombs),
V is voltage $V_{BE}$,
K is Boltzman's constant, and
T is temperature (°K.).

A temperature change $\Delta T$ produces a related change in voltage $V_{BE}$. A temperature coefficient $\theta_1$ of a silicon transistor such as transistor 32 is negative and typically lies in the range of −1 mV/°K. to −3 mv/°K. It is herein recognized that if the temperature changes by an amount $\Delta T$, and if appropriate values of resistors 34 and 36 are chosen, the collector-emitter voltage $V_{CE}$ of transistor 32 changes by an amount $\Delta V_{CE}$ in accordance with the expression $$\Delta V_{CE} = \theta_1(1 + R36/R34)\Delta T = \theta_2 \Delta T,$$
where $\theta_1$ is a temperature coefficient of the base-emitter junction of transistor 32 of circuit 30, $\theta_2$ is a different temperature coefficient such as that of a semiconductor device being temperature compensated, and (1+R36/R34) is a multiplier factor relating temperature coefficients $\theta_1$ and $\theta_2$.

Thus the temperature coefficient of transistor 32 can be tailored to match the temperature coefficient $\theta_2$ of semiconductor devices being compensated, e.g., devices in peaking control circuit 14, simply by changing the values of resistors 34 and 36, so that both circuit 30 and the compensated semiconductor devices in peaking circuit 14 have substantially the same temperature coefficient. Circuit 30 is a temperature dependent voltage source for providing, at the wiper of potentiometer 22, a divided voltage with temperature coefficient $\theta_2$ for modifying the peaking control voltage at the wiper of potentiometer 22. Variations in the magnitude of the collector current of transistor 32 are a function of temperature coefficient $\theta_2$. The conduction of transistor 32 produces a gain change (e.g., a decrease in gain) in circuit 14 which is opposite to a gain change (e.g., an increase in gain) produced by the temperature dependency of the semiconductor devices in peaking circuit 14. The offsetting gain produced by circuit 30 results in a substantially fixed, temperature invariant gain of circuit 14 for a given setting of control 20.

Short term temperature related effects due to self heating of the semiconductor devices in circuit 14 are compensated for because the thermal time constant of the self heating process of transistor 32 closely approximates the thermal time constant of the self heating process of the semiconductor devices in circuit 14, and also because the temperature coefficient of circuit 30 has been made to closely approximate the temperature coefficient of the semiconductor devices in circuit 14. As noted above, this is accomplished by proper choice of the values of resistors 34 and 36 to determine the multiplier factor in establishing temperature coefficient $\theta_2$ for circuit 30 to match the temperature coefficient of the semiconductor devices in circuit 14. Long term temperature related effects due to ambient temperature changes are compensated for automatically since ambient temperature changes affect both circuit 30 and circuit 14 similarly. Thus circuit 30 will compensate for the self-heating of semiconductor devices in circuit 14 for the first few minutes after both circuits 30 and 14 are energized, and will afterwards compensate for long term ambient temperature changes.

A resistor 24 is a load for coupling circuit 21, and also assists to determine the sensitivity of the system to a change in the gain control voltage. For example, decreasing and increasing the value of resistor 24 respectively serve to produce smaller and larger signal gain changes for a given change in the magnitude of the peaking control voltage from potentiometer 20.

The values of resistors 22 and 24 determine the magnitude of current conducted by transistor 32. Small values of these resistors will increase the current conducted by transistor 32 and will promote increased self-heating of transistor 32. This effect may be used to achieve a faster response time for circuit 30, if needed to match a fast (self heating) response time of the semiconductor devices in circuit 14.

The value of resistor 36 could be zero ohms, which would result in transistor 32 exhibiting a diode-connected configuration with a temperature coefficient of 2mv/°C. rather than that exhibited by a transistor configuration. The temperature coefficient of circuit 30 increases as the value of resistor 36 increases. Resistor 34 should have a value sufficient to maintain the base-emitter junction of transistor 32 forward biased.

The multiplier factor, 1+R36/R34, is greater than or equal to unity. At unity, transistor 32 exhibits a diode configuration with the smallest temperature coefficient.

Circuit 30 can produce either a positive or a negative temperature coefficient effect depending upon how circuit 30 is used in a given system. For example, the arrangement of circuit 30 in FIG. 1 produces a positive temperature coefficient effect at the wiper of potentiometer 22. That is, the collector-to-emitter voltage $V_{CE}$ of transistor 32 decreases with increasing temperature, whereby the wiper voltage of potentiometer 22 exhibits a related increase with increasing temperature.

FIG. 2 illustrates alternative embodiments of the temperature compensation arrangement of FIG. 1, wherein corresponding elements are identified by the same reference number.

Alternative embodiment (a) employs an NPN transistor 32a rather than a PNP transistor 32 as in FIG. 1. Here, as in FIG. 1, a positive temperature coefficient effect is produced at the wiper of potentiometer 22 since the magnitude of the collector-to-emitter voltage of transistor 32a decreases and thereby the wiper voltage of potentiometer 22 increases with increasing temperature.

Alternative embodiments (b) and (c) of FIG. 2 produce a negative temperature coefficient effect at the wiper of potentiometer 22, since in both cases the collector-to-emitter voltages of PNP transistor 32b of circuit 30b and of NPN transistor 32c of circuit 30c decrease with increasing temperature.

What is claimed is:

1. Apparatus for compensating a temperature dependent characteristic of a semiconductor device having a first temperature coefficient, comprising:

an electrical circuit including a transistor, a first resistor and a second resistor, wherein
said transistor has a first electrode, a second electrode coupled to an operating potential, and a third electrode coupled to an operating potential and with said second electrode defining a main current conduction path of said transistor, said first and second electrodes being associated with a forward biased junction of said transistor and said first and third electrodes being associated with a reverse biased junction of said transistor;
said first resistor couples said second electrode to said first electrode;
said second resistor couples said third electrode to said first electrode, the ratio of the value of said second resistor to the value of said first resistor being selected such that said electrical circuit exhibits a second temperature coefficient approximating said first temperature coefficient of said semiconductor device whereby an output voltage associated with said main conduction path exhibits a magnitude which varies with temperature in accordance with said second temperature coefficient;
means for deriving from said output voltage a control signal having a magnitude which varies in accordance with said second temperature coefficient; and
means for coupling said control signal to said semiconductor device to alter said characteristic of said semiconductor device in a direction opposite to a direction produced by temperature variations
wherein
said semiconductor device is an integrated circuit; and
said temperature compensating apparatus is located external to said integrated circuit.

2. Apparatus according to claim 1, wherein
said second temperature coefficient is proportional to a multiplier factor of (1+R2/R1), where R1 is the value of said first resistor and R2 is the value of said second resistor.

3. Apparatus according to claim 1, wherein
said first, second and third electrodes are base, emitter and collector electrodes, respectively, and
said main current conduction path is coupled between a first operating potential and a second operating potential less positive than said first operating potential.

4. Apparatus according to claim 3, wherein
impedance means is coupled between said main current conduction path and said second operating potential; and
said control signal is derived from said impedance means.

5. Apparatus according to claim 3, wherein
impedance means is coupled between said main current conduction path and said first operating potential; and
said control signal is derived from said impedance means.

* * * * *